US005113154A

United States Patent [19]

Convert et al.

[11] Patent Number: 5,113,154

[45] Date of Patent: May 12, 1992

[54] MICROWAVE GENERATOR DEVICE WITH VIRTUAL CATHODE

[75] Inventors: Guy Convert, Vincennes; Jean-Pierre Brasile, Gif Sur Yvette, both of France

[73] Assignee: Thomson-CSF, Puteaux, France

[21] Appl. No.: 582,913

[22] PCT Filed: Feb. 16, 1990

[86] PCT No.: PCT/FR90/00112

§ 371 Date: Oct. 17, 1990

§ 102(e) Date: Oct. 17, 1990

[87] PCT Pub. No.: WO90/09675

PCT Pub. Date: Aug. 23, 1990

[30] Foreign Application Priority Data

Feb. 17, 1989 [FR] France ................................ 89 02081

[51] Int. Cl.[5] ......................... H01J 25/74; H03B 9/01

[52] U.S. Cl. ........................................ 331/79; 315/39; 331/81; 331/86

[58] Field of Search ....................... 331/79, 80, 81, 86; 315/3, 4, 5, 5.18, 5.19, 5.24, 5.31, 5.32, 5.35, 39; 328/220, 227

[56] References Cited

U.S. PATENT DOCUMENTS

| | | | |
|---|---|---|---|
| 3,084,293 | 4/1963 | Munushian et al. | 330/43 |
| 4,150,340 | 4/1979 | Kspetanakos et al. | 331/81 |
| 4,345,220 | 8/1982 | Sullivan | 331/79 |
| 4,730,170 | 3/1988 | Kwan et al. | 331/79 |

FOREIGN PATENT DOCUMENTS 914307 1/1963 United Kingdom .

OTHER PUBLICATIONS

1983 IEEE International Conference on Plasma Science, 23-25 May 1983, San Diego, Calif., IEEE Conference Record-Abstracts, IEEE (New York, U.S.), T. J. T. Kwan et al.: "Microwave generation by virtual cathodes and reflexing systems", p. 40, resume 2D6.

Journal of Applied Physics, vol. 32, No. 12, Dec. 1961, "Space-Charge Instabilities in Electron Diodes and Plasma Converters", C. K. Birdsall et al., pp. 2611-2618.

Journal of Applied Physics, vol. 34, No. 10, pp. 2946-2955, Oct. 1963, "Space-Charge Instabilities in Electron Diodes", William B. Bridges et al.

SPIE vol. 873 Microwave and Particle Beam Sources and Propagation (1988), pp. 92-103, "Relativistic klystron amplifier", M. Friedman et al.

*Primary Examiner*—Siegfried H. Grimm

*Attorney, Agent, or Firm*—Oblon, Spivak, McClelland, Maier & Neustadt

[57] ABSTRACT

A microwave generator that uses an electron beam and the phenomenon of the oscillating virtual cathode, but makes it possible to obtain energy with improved spectral quality and conversion efficiency as compared with standard vircator generators. This is achieved by the separate use of the electrons coming from the virtual cathode (80), that is, transmitted electrons (80) or reflected electrons (81) to convert their kinetic energy into microwave energy (4).

10 Claims, 3 Drawing Sheets

MICROWAVE GENERATOR DEVICE WITH VIRTUAL CATHODE

BACKGROUND OF THE INVENTION

The object of the present invention is a microwave generator device using the virtual cathode phenomenon.

DISCUSSION OF BACKGROUND

A known way of generating microwaves consists notably in the use of devices called vircators which make advantageous use of the space charge effects in electron beams produced by the gun of an electron tube. Indeed, as is known, it is these effects that, for given voltages, fix a maximum value for the current that may be produced by an electron gun, or again may be carried in a given space for a set of electrodes with a given geometry. In a vircator, there is injected, into a defined space, a stream of electrons most often equal to several times the maximum current that could effectively cross this space. There is then an accumulation of electrons which form a potential well, called a virtual cathode, and this accumulation prompts the reflection of a variably large fraction of the electrons of the beam. This virtual cathode is unstable, that is, the amplitude of its potential well and its position oscillate, leading to a periodic variation in the number of reflected or transmitted electrons. A device such as this enables the creation of electromagnetic fields with high microwave power values and in a restricted volume. However, it is observed that the power is emitted in several modes in a sequence of simultaneous or successive frequencies. The applications of signals of this type are thereby quite restricted. Besides, the conversion efficiency is poor (of the order of 2% to 3% at most) as compared with the efficiency that can be obtained with other generators, such as standard velocity modulated electron tubes.

SUMMARY OF THE INVENTION

An object of the present invention is a microwave generator that uses the oscillating virtual cathode phenomenon but makes it possible to obtain microwave energy of better spectral quality and with higher conversion efficiency than with standard vircators.

This is achieved by the separate use of the electrons of a given phase (i.e. transmitted electrons or reflected electrons) to convert their kinetic energy into microwave energy.

More precisely, the object of the invention is a microwave generator device comprising:

a electron gun, capable of producing an electron beam in a region of injection, the current carried being sufficient to prompt the formation of a virtual cathode;

an output microwave circuit, performing the conversion of the kinetic energy of the electrons into a microwave energy, such that the energy of the electrons that it picks up is in phase, either in using solely the energy of the transmitted electrons or in using solely the energy of the electrons reflected by the virtual cathode, or again in using both the energy of the transmitted electrons and that of the reflected electrons, but with this energy being suitably phase-shifted.

BRIEF DESCRIPTION OF THE DRAWINGS

Other objects, particular features and results of the invention will emerge from the following description, given as an non-restrictive example and illustrated by the appended figures, of which.

In these different figures, the same references pertain to the same elements.

DETAILED DESCRIPTION OF THE PREFERRED EMBODIMENT

Figure 1:
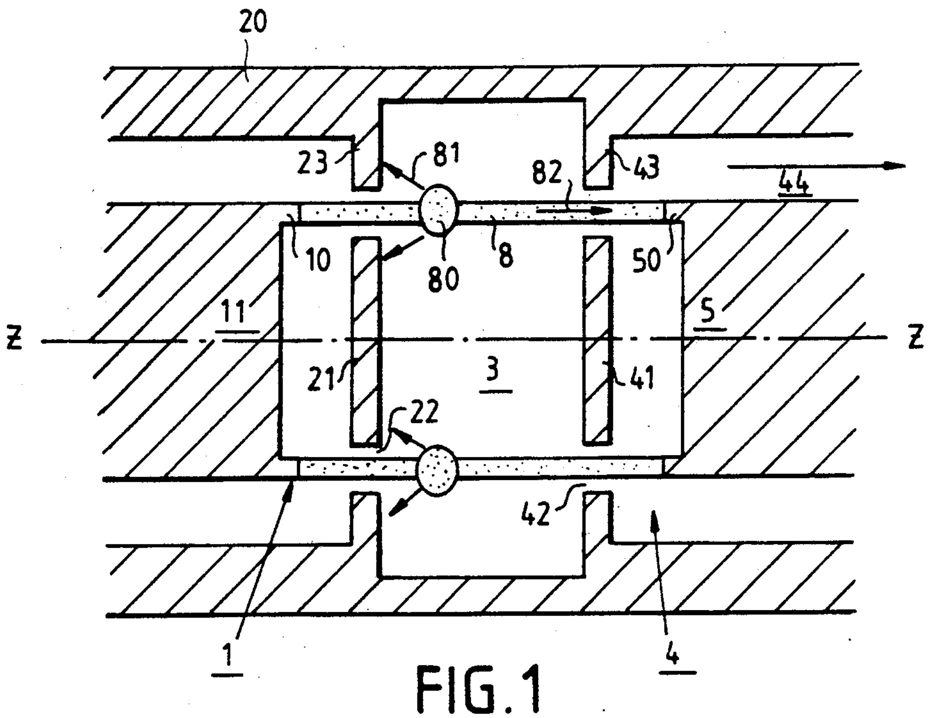
FIG. 1 shows a first embodiment of the generator device according to the invention, wherein the output microwave circuit uses the electrons transmitted by the virtual cathode.

FIG. 1 therefore represents a first embodiment of the device according to the invention, seen in a longitudinal schematic view.

The generator according to the invention is a structure with a shape generated by revolution around the longitudinal axis ZZ.

It has an electron gun 1, formed by a cathode 11 and an anode, made up of a mounting 20 and a screen 21. The cathode 11 takes the form of a conductive cylinder with an axis ZZ, the circumference of which forms a projection 10, in such a way that the electrons emitted by this cathode form an annular beam, represented by a dotted zone 8 in the figure. The mounting 20 of the anode is formed by a hollow cylinder, having the same axis as the cathode; it is closed by an annular shoulder 23 and a disk-shaped screen 21, that leaves an annular slot 22 for the passage of the electron beam 8. The screen 21 is, for example, fixed by three lugs (not shown) to the shoulder 23.

The generator according to the invention also has an output microwave circuit 4 which, in this embodiment, is of the coaxial type. It is formed by an internal conductive cylinder 5 and an external conductor constituted by the extension of the mounting 20, between which an annular space 44 is defined. The output circuit is substantially symmetrical with the electron gun 1 in relation to a plane normal to the plane of the figure, that is, the external conductor has an annular shoulder 43 and a screen 41 supported for example, by means of lugs, on the shoulder 43 and defining, with this shoulder, a circular slot 42 for the passage of the electrons of the beam 8. This beam is received by an annular projection 50 of the internal conductor 5. More generally, the designs of the output circuit 4 and of the gun 1 are such that the two impedances are close to each other.

Between the elements 21, 23, on the one hand, and 41, 43, on the other hand, there is a zone 3, called an injection region. This zone is limited laterally by the wall 20.

This device works as follows:

The application to the cathode 11 of a voltage that is negative in relation to that of the anode prompts the emission of the annular electron beam 8. For example, the mounting 20, the screen 21 and the elements of the output circuit 4 are at the ground potential, and a voltage $-V_0$ is applied to the cathode 11. The parameters are chosen in such a way that a virtual cathode 80 is formed in the injection region 3. An arrow 82 has been used to represent the electrons transmitted by the virtual cathode 80 and arrows 81 represent the electrons reflected by this virtual cathode. Furthermore, by the use of means that are not shown, a magnetic field that is longitudinal (along the axis ZZ) is preferably applied to the structure, in order to focus the beam 8 thus produced.

The mechanism of formation of a virtual cathode is recalled here below. Inside an electron beam there is a space charge: on the axis of the beam, the potential and the velocity of the electrons are lower than at the periphery of this beam. If the density of electrons, and, consequently, the current conveyed, increase, the potential and the velocity of the electrons decreases until it reaches zero: the electrons then form a negatively charged heap, forming a potential well called a virtual cathode. This virtual cathode oscillates and the frequency of the oscillations depends notably on the injection current. It is commonly measured in Gigahertz. Besides, the maximum current intensity beyond which the electrons form a virtual cathode depends on the potential of the electron beam, as well as on the dimensions of the beam and of the injection region 3: the maximum current for a given electron beam is lower when the injection zone has a greater diameter.

According to the invention, the dimensions of the device (electron gun and injection zone) and the current of the electron beam are chosen in such a way that this current is greater than the maximum current liable to go through the region 3, thus leading to the formation of a virtual cathode. As a result, the electrons transmitted represent a current modulated at the oscillation frequency of the virtual cathode. The electrons transmitted, and they alone, have their kinetic energy converted into an electromagnetic field by the output circuit 4, more precisely in the braking space between the conductor 5 and the screen 41. The energy produced is transmitted by the output coaxial circuit 4 towards the exterior.

It appears that the energy thus produced is produced with an efficiency far greater than that of standard vircators. Indeed, the research done by the Applicant has shown that one of the reasons for the low efficiency of standard vircators was that fact of using a coupling circuit that imposed an electromagnetic field with a substantially equal phase on all the electrons, both transmitted and reflected by the virtual cathode. However, these two sorts of electrons are substantially in phase opposition, and the energies that they produce cancel each other in great measure. According to the invention, the transmitted or reflected electrons are therefore used separately. In the present embodiment, only the tranmitted electrons are used.

Furthermore, the fact of using, according to the invention, the electrons of a same phase has the effect of making it possible to set up a narrower coupling between electrons and output circuit, and consequently to obtain electromagnetic energy of higher spectral quality.

An alternative embodiment (not shown) consists in positioning the output circuit 4 in such a way that only the electrons reflected by the virtual cathode are used.

It must be noted, moreover, that the dimensions of the gun and of the injection region are preferably chosen so that the current of the beam is greater than, but close to, the maximum current, so that the current transmitted is, on an average, a substantial fraction of the total current injected into the injection region.

Figure 2:
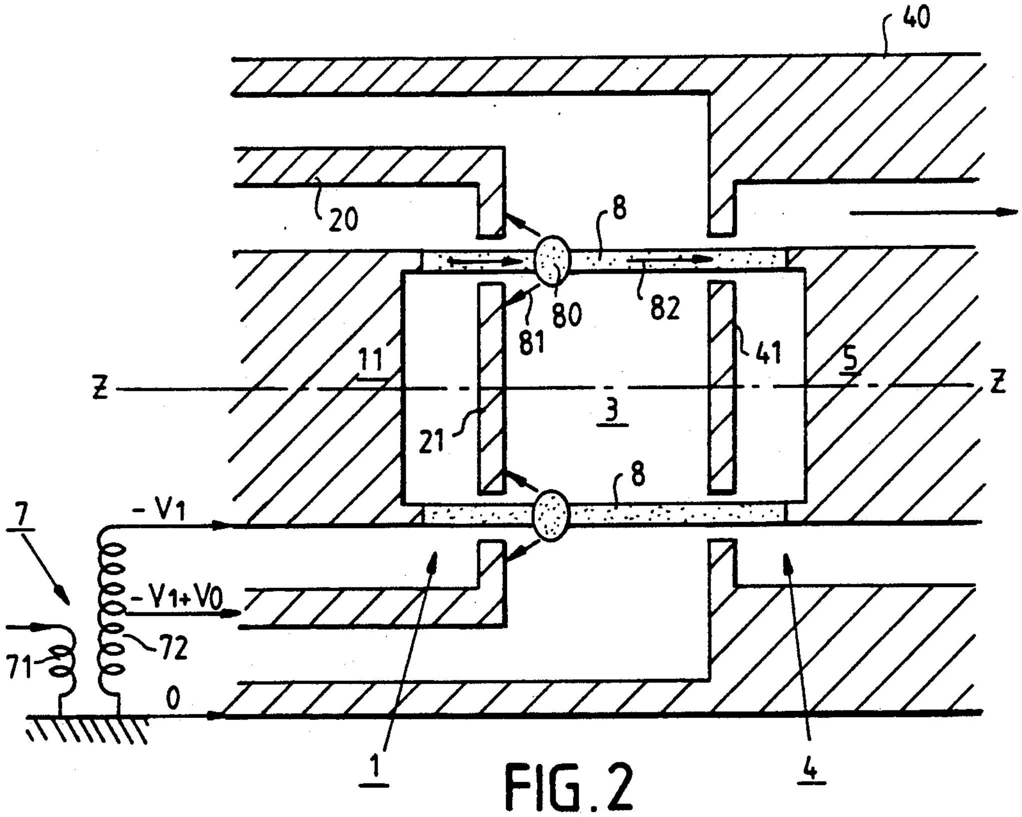
FIG. 2 shows a second embodiment of the device according to the invention, wherein the output microwave circuit further provides for a post-acceleration of the electrons used.

FIG. 2 shows another embodiment of the device according to the invention, which has means of post-acceleration of the electrons used, also seen in a longitudinal schematic view.

As an example, the generator shown in FIG. 2 repeats the structure of the generator of FIG. 1, except that the output circuit 4 is electrically insulated from the electron gun 1. More precisely, the mounting 20 forming the anode of the electron gun has no electrical contact with the external conductor, now referenced 40, of the output circuit 4. As an example, the conductor 40 extends around the mounting 20 in the form of a hollow cylinder having the same axis ZZ as this mounting. This embodiment further includes means 7 for the application, between the cathode 11 and the output circuit 4, of a voltage $V_1$ that is greater than the cathode/anode voltage $V_0$. For example, the means 7 are constituted by a transformer, the primary winding 71 of which receives the supply voltage and the secondary winding 72 of which is connected:

at one of its ends to the wall 40 (ground potential);

at its other end to the cathode 11 (potential $-V_1$);

at an intermediate point to the anode 20, a point such that the potential therein is equal to $-V_1+V_0$.

It must be noted that, as is known, for the formation of a virtual cathode to be still possible when the voltage $V_1$ used is greater than the voltage $V_0$ of the previous embodiment, it is necessary to increase the length of the injection region 3, and this increase must be all the greater as the ratio $V_1/V_0$ chosen is higher.

Figure 3:
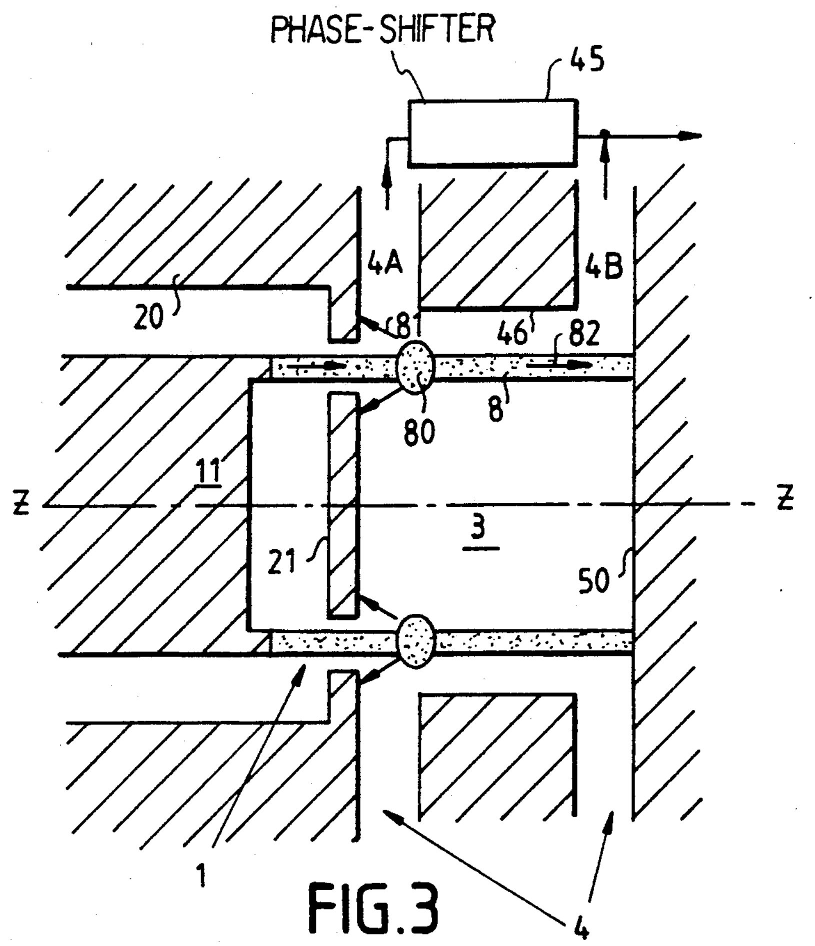
FIG. 3 shows another embodiment of the device according to the invention, wherein the output microwave circuit uses, firstly, the electrons transmitted by the virtual cathode and, secondly, the electrons reflected by this virtual cathode but suitably phase-shifted.

FIG. 3 shows another embodiment of the generator according to the invention, wherein the electrons transmitted and the electrons reflected by the virtual cathode are both used.

This figure again shows the electron gun 1 formed by the cathode 11 and the anode 20, 21. Here too, the gun 1 produces an electron gun 8 under conditions such that there is the formation of a virtual cathode 80 with reflection (arrows 81) of a part of the electrons and transmission (arrow 82) of another part of the electrons towards, for example, a metal wall 50 demarcating the injection region 3.

In this embodiment, the output microwave circuit 4 has two channels: one leads into in a region referenced 4A, between the anode 20 and the virtual cathode 80, and is designed to recover the energy of the reflected electrons 81; the other leads into a region referenced 4B, between the virtual cathode 80 and the wall 50, and it is designed to recover the energy of the transmitted electrons 82. Since the electrons 81 reflected by the virtual cathode are reflected with a mean time lag of the order of a half-period of oscillations of this virtual cathode with respect to the electrons 82 transmitted, it is necessary, in order to cumulate their effects, to phase-shift the energy produced by one set of electrons by a value substantially equal to 180 degrees with respect to the other set of electrons; this is represented schematically by a phase-shifter 45, which can be made by any known means and connected to one of the channels, 4A or 4B, before the energy values existing in the two channels combine to form the output energy.

It must be noted that the wall 46, between the channels 4A and 4B, should be of a thickness sufficient to prevent the fields present in the two channels from getting coupled together before the virtual cathode 80, this thickness being of the magnitude of the distance of the wall 46 from the virtual cathode.

FIG. 3 shows a particular embodiment of the circuit 4. Other variants are clearly possible and consist, for example, in making, for each of the channels 4A and 4B, a coaxial type structure such as is described in FIG. 1 for the circuit 4.

Figure 4:
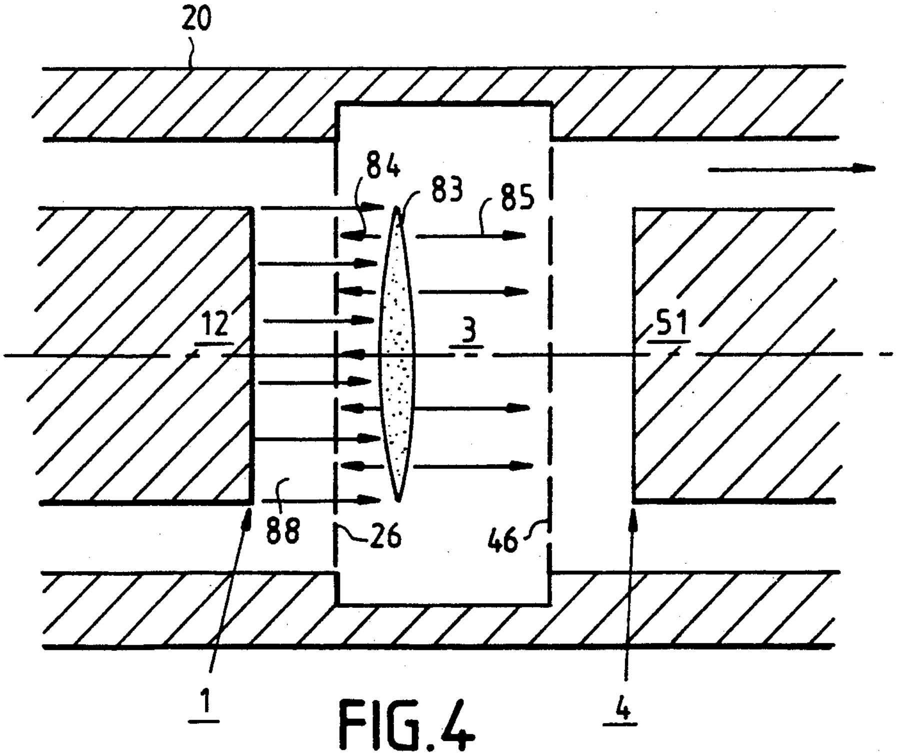
FIG. 4 shows another embodiment wherein the produced beam is a solid cylinder.

FIG. 4 represents another embodiment of the device according to the invention, wherein the beam produced by the gun is a solid cylinder, again seen in a longitudinal schematic section.

This figure, by way of example, again shows a structure similar to that of FIG. 1, except that the emissive surface of the cathode, now referenced 12, is disk shaped so as to emit a full cylindrical electron beam 88. In the same way, the internal conductor of the output circuit 4, now referenced 51, is formed by a disk-shaped plane surface. The screens 21 and 41 of the FIG. 1 have been replaced herein by elements, referenced 26 and 46, constituted by metal grids or foils, sufficiently thin for their absorption of electrons to be very low.

The working of this device is similar to that described for FIG. 1, with the formation of a virtual cathode 83, reflected electrons 84 and transmitted electrons 85, the kinetic energy of which is converted into microwave energy by the output circuit 4.

It must be noted that, to make it possible to obtain satisfactory operation, the diameter of the cathode 12 must be substantially smaller than the wavelength of the microwave energy obtained at output, for example, of the order of a half wavelength. In practice, however, cathodes of greater diameter may be used, owing to the fact that the electrons tend to assemble at the periphery of the virtual cathode.

Figure 5:
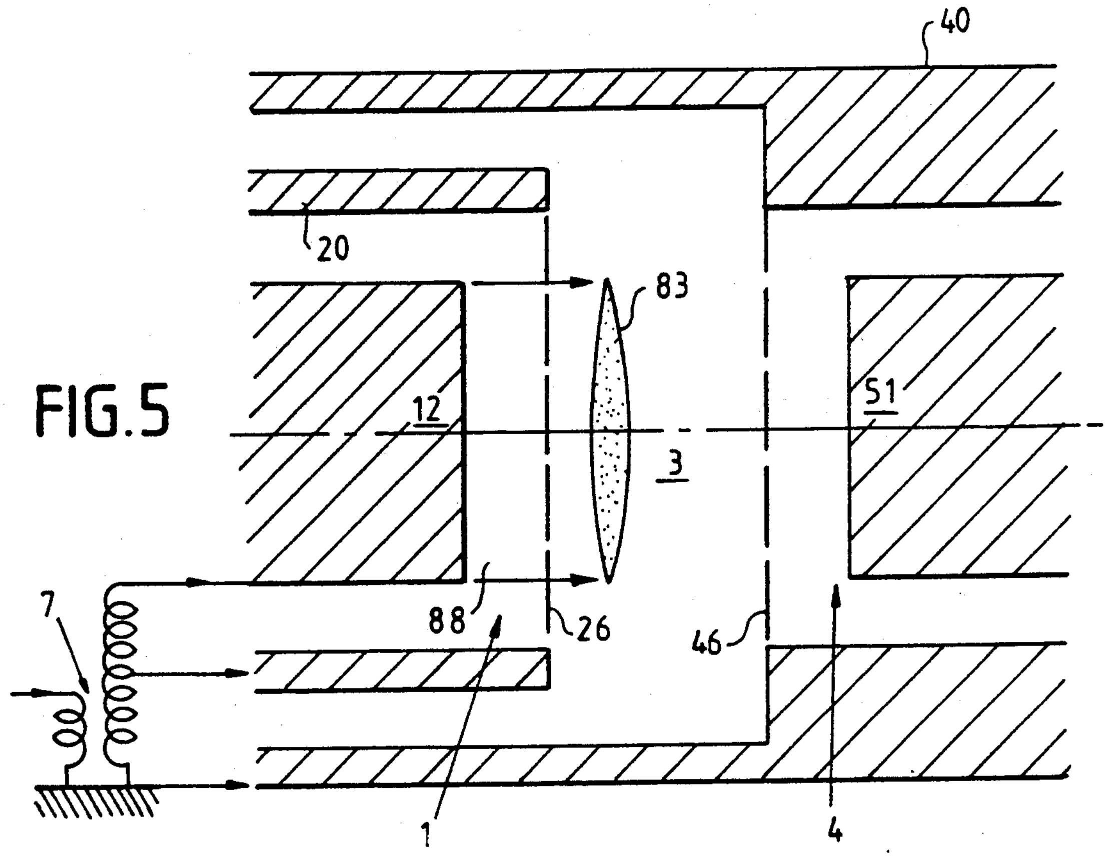
FIG. 5 is another solid cylinder embodiment having post-acceleration means.

FIG. 5 shows another embodiment of the generator according to the invention, wherein the electron being used is a full cylindrical beam and wherein the generator further includes post-acceleration means.

This figure again shows a structure similar to that of FIG. 2, except with respect to the cathode 11 of the gun 1, the central conductor 5 of the output circuit 4 and the screens 21 and 41, respectively replaced by the elements 12, 51, 26 and 46, as described with reference to FIG. 4.

The same observations as those made with reference to FIG. 4 can be made here.

Figure 6:
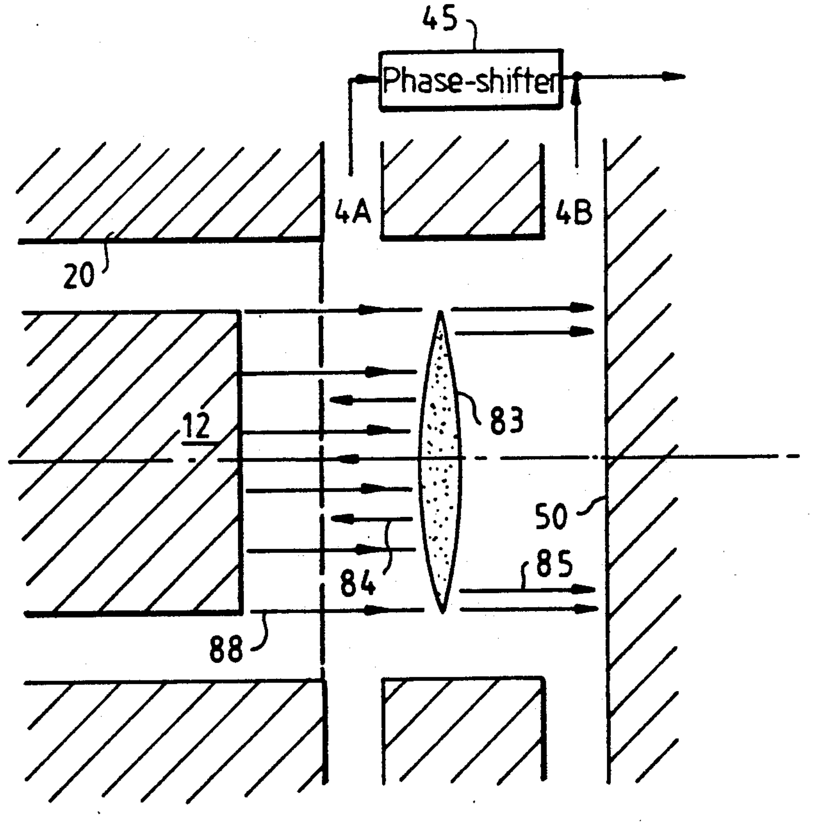
FIG. 6 is yet another full cylinder electron beam corresponding to utilization of both transmitted and reflected electrons from the virtual cathode.

In the same way, FIG. 6 shows an embodiment similar to that of FIG. 3, but wherein the annular electron beam is replaced by a full cylindrical electron beam.

We therefore again have a structure similar to that of FIG. 3, except as regards the structure of the cathode 11, now referenced 12, and the electron beam 8 which becomes a full cylinder referenced 88, as in the case of FIGS. 4 and 5.

We claim:

1. A microwave generator device comprising:

an electron gun producing an electron beam in a region of injection wherein a current carried in said region is sufficient to form a virtual cathode;

an output microwave circuit for converting the kinetic energy of the electrons into microwave energy wherein said output microwave circuit includes a means for separating the electrons transmitted from the electrons reflected by said virtual cathode so that said output microwave circuit receives substantially in-phase energy.

2. Device according to claim 1, wherein said microwave circuit is positioned so as to receive only the electrons transmitted by the virtual cathode.

3. Device according to claim 1, wherein said microwave circuit is positioned so as to receive only the electrons reflected by the virtual cathode.

4. Device according to claim 1, wherein said microwave circuit includes a first channel, receiving the transmitted electrons, and a second channel, receiving the reflected electrons, and a phase-shifter phase-shifting the energy produced by one of the channels substantially by 180 degrees.

5. Device according to claim 1, wherein said microwave circuit is of the coaxial type.

6. Device according to claim 1 wherein said microwave circuit is electrically isolated from the electron gun and that a voltage of acceleration ($V_1$) of the electrons is applied between gun and output circuit.

7. Device according to claim 1, wherein the electron beam is in the form of a hollow cylinder.

8. Device according to claim 1, wherein the electron beam is in the form of a full cylinder.

9. Device according to claim 1, wherein it further includes means of application of a magnetic field for focusing the electron beam.

10. A microwave generator device comprising:

an electron gun producing an electron beam in a region of injection wherein a current carried in said region is sufficient to form a virtual cathode;

an output microwave circuit for converting the kinetic energy of electrons in said beam into microwave energy wherein said output microwave circuit includes a first channel for receiving electrons which are transmitted through said virtual cathode and a second channel for receiving electrons reflected by said virtual cathode and a phase-shifter for phase shifting the energy produced by one of said channels substantially by 180°.

* * * * *